United States Patent [19]

Chen et al.

[11] Patent Number: 4,994,154
[45] Date of Patent: Feb. 19, 1991

[54] HIGH FREQUENCY ELECTROCHEMICAL REPAIR OF OPEN CIRCUITS

[75] Inventors: Chengjun J. Chen, Yorktown Heights; Robert J. von Gutfeld, New York, both of N.Y.

[73] Assignee: Internatinal Business Machines Corporation, Armonk, N.Y.

[21] Appl. No.: 475,636

[22] Filed: Feb. 6, 1990

[51] Int. Cl.⁵ .......................... C25D 5/02; C25D 7/12
[52] U.S. Cl. .......................................... 204/16; 204/15
[58] Field of Search ................................ 204/16, 15

[56] References Cited

U.S. PATENT DOCUMENTS

| | | | |
|---|---|---|---|
| 2,955,959 | 10/1960 | De Rose | 427/49 |
| 3,506,545 | 4/1970 | Garwin et al. | 204/15 |
| 3,645,855 | 2/1972 | Wisman | 204/16 |
| 3,833,375 | 9/1974 | Moscony et al. | 96/36.2 |
| 3,960,674 | 6/1976 | Coucoulas | 204/16 |
| 4,103,043 | 7/1978 | Hsieh | 427/49 |
| 4,217,183 | 8/1980 | Melcher et al. | 204/15 |
| 4,239,789 | 12/1980 | Blum et al. | 427/53.1 |
| 4,259,367 | 3/1981 | Dougherty | 427/96 |
| 4,340,617 | 7/1982 | Deutsch et al. | 427/53.1 |
| 4,349,583 | 9/1982 | Kulynych et al. | 427/53.1 |
| 4,383,016 | 5/1983 | Postupack | 427/14.1 |
| 4,403,410 | 9/1983 | Robinson | 29/830 |
| 4,418,264 | 11/1983 | Thorwarth | 219/78.01 |
| 4,496,900 | 1/1985 | Di Stefano | 324/51 |
| 4,608,117 | 8/1986 | Ehrlich et al. | 156/610 |
| 4,611,744 | 9/1986 | Fraser | 29/402.18 |
| 4,615,904 | 10/1986 | Ehrlich et al. | 427/38 |
| 4,630,355 | 12/1986 | Johnson | 29/575 |
| 4,704,304 | 11/1987 | Amendola et al. | 427/57 |
| 4,919,971 | 4/1990 | Chen | 427/98 |

Primary Examiner—John F. Niebling
Assistant Examiner—William T. Leader
Attorney, Agent, or Firm—Jackson E. Stanland

[57] ABSTRACT

The invention comprises a two step method for the repair of "opens" in an electronic circuit wherein initially the open is contacted with a plating solution and a high frequency current is passed through the ends of the open in the circuit with the plating solution enabling the current to complete the path. Metal growth commences between the ends of the open to form a near open. Then the repair is completed by contacting the site with a high speed plating solution and applying a low frequency current.

22 Claims, 1 Drawing Sheet

HIGH FREQUENCY ELECTROCHEMICAL REPAIR OF OPEN CIRCUITS

The invention relates to a two step method for the repair of "opens" (as defined hereinafter) on electronic material which method is based upon SIR (self induced repair). In the first repair stage, the electronic material is partially covered or immersed in a plating solution comprising either an essentially neutral electrolyte or electroless metal solution. A high frequency current is passed through the open ends of the circuit with plating solution enabling the current to complete the path. Resulting Joule losses i.e. the conversion of electrical energy produces heat directly proportional to the resistance of the current path, square of the current times the time. Some of the localized heating in the solution in the region of the break is transferred to the circuit by thermal conduction from the liquid. As a result of the heating (in the case of electroless solutions) or the thermobattery effect (in the case of electrolytic solutions without reducing agents), metal deposition of a few microns in width is initiated across the circuit break. The metal bridging the open or gap reduces the infinite resistance of the open to a finite value. For the second repair stage, the sample is treated as a "near open." The repair is completed by contacting the site containing the now relatively high resistance defect in a high speed plating solution and applying low frequency current of about 50 Hz or greater.

THE PRIOR ART

A key element in present day circuit board technology is the capability for repair of local defects, likely to occur in almost any large scale manufacturing process. The probability of a defect is of course greatly dependent on the maturity of the manufacturing process and often decreases to near zero once the manufacturing process is well understood and has had time to develop. Typically, circuit defects consist of "shorts", "near shorts", "near opens" and "opens."

"Shorts" consist generally of a line with extraneous metallization in electrical contact with a neighboring line.

A "near short" is characterized by unwanted metallization extending from one line to a neighboring one, without electrical contact between the two. Due to the very close electrical proximity of the two lines resulting from the "near short" defect, there is high probability for a short to develop.

"Near-opens" are characterized by circuit lines that are locally thinner or narrower than the normal line dimensions giving rise to a locally higher line impedance. In the event of a high current surge, the near open can melt or vaporize resulting in an open circuit.

The term "opens" as used herein describes physical breaks in the circuit line which completely interrupt current continuity and are characterized by an infinite DC resistance. Opens can develop from a variety of problems occurring prior, during or after circuit manufacture. This kind of circuit defect is generally caused by one or more of the following: submicron or small cracks, several microns of missing line due to dirt, mask or lithography imperfections, poor adhesion of the metallization to the board or improper handling of the board during processing.

The repair of near-opens on boards, modules and chip carrier substrates using SIR is disclosed in pending U.S. application Ser. No. 248,889, now U.S. Pat. No. 4,919,971. One process for achieving near-open repair involves the application of an ac current (voltage) to the defective circuit while in contact with acid copper, typically a solution containing 1 M $CuSO_4$ and 0.5 M $H_2SO_4$. The current, as it passes through the neckdown region with its relatively higher impedance, causes the copper in the area of the near-open defect to become warmer than the immediately adjacent copper. Under these conditions a thermally driven electrochemical exchange plating occurs. This phenomenon is also termed the "thermobattery effect." Details of this type of plating were first described in relation to laser plating in which no external voltage was applied to the circuit that was undergoing metal deposition either for repair or maskless patterning. (See U.S. Pat. No. 4,349,583)

One theory applicable to the basic electrochemical mechanism that applies to both laser plating and the repair of neckdowns is that the locally hotter region of the circuit becomes cathodic due to a positive shift in the rest potential, while the colder adjacent regions become anodic. Plating occurs in the neckdown region causing a local deposition of a metal, usually copper, for copper circuit repair, in the thinned region which is self-limiting and terminates once the impedance of the neckdown is comparable to that of the defect free region of the line. Simultaneously, copper dissolution from colder regions occurs during the deposition and charge neutrality of the total reaction is maintained.

Globally, the copper solution suffers no net gain or loss of copper ions due to the simultaneous plating and dissolution. Locally, in the region of maximum plating, there may be copper ion depletion unless sufficient solution agitation is provided. The available amount of metallic copper for dissolution to copper ions is generally much larger than that of the copper ions undergoing reduction (i.e. plating) due to the relatively large area of copper that remains near ambient temperature. Thus, the degree of dissolution on the colder circuit regions is generally small. To further minimize the extent of circuit line dissolution, bulk copper in the form of a small washer or block can be placed in direct contact with the line under repair, close to the region of the defects. Most of the sacrificial dissolution will then be contributed by the externally added copper.

This process for repair of near-open circuits is significant with respect to the present invention because certain steps in the process are utilized as a part of the process disclosed herein which relates to the repair of opens.

SUMMARY OF THE INVENTION

Attempts to repair finite circuit gaps or open circuits (as opposed to near opens) using the same SIR technique as applied to neckdowns as described above in the past have been generally unsuccessful. However, with some modification of the SIR procedure disclosed above it is now possible to repair open circuits using a two step process.

It has been determined that the frequency of the ac current (which can range between about 0.04 kHz to 5000 kHz) passed through the circuit containing the open, in contact (either submerged or covered by one or several droplets) with an unacidified (neutral) metal ion solution, results in a rapid growth of the metal in the gap (i.e. the open) in the circuit sufficient to establish electrical continuity. The preferred frequency range for both the electroless open circuit repair and the electrolytic open circuit repair is between about 1 kHz and 2000 kHz.

Electrically continuous bridging of the gap can occur in less than 60 seconds after initial application of the ac current. Metal deposition in the form of dendrite growth (or other forms) occurs at a linear rate of up to 2-5 μm/s with the current (voltage) being ramped from 0 to several milliamps over the time span of the repair. Slow current ramping is normally undertaken to initiate controlled growth of the metal, typically copper for copper circuit opens in the region of the open. Following this step, the circuit is treated as a near open or neckdown, and the SIR procedure as described above for near-open repair is used i.e. acidified metallic ionic solution and low frequency ac current as the second repair step to increase the cross sectional area and thereby the conductivity of the connecting dendrite or initial copper bridge.

DETAILED DESCRIPTION OF THE PREFERRED EMBODIMENTS OF THE INVENTION

Figure 1:
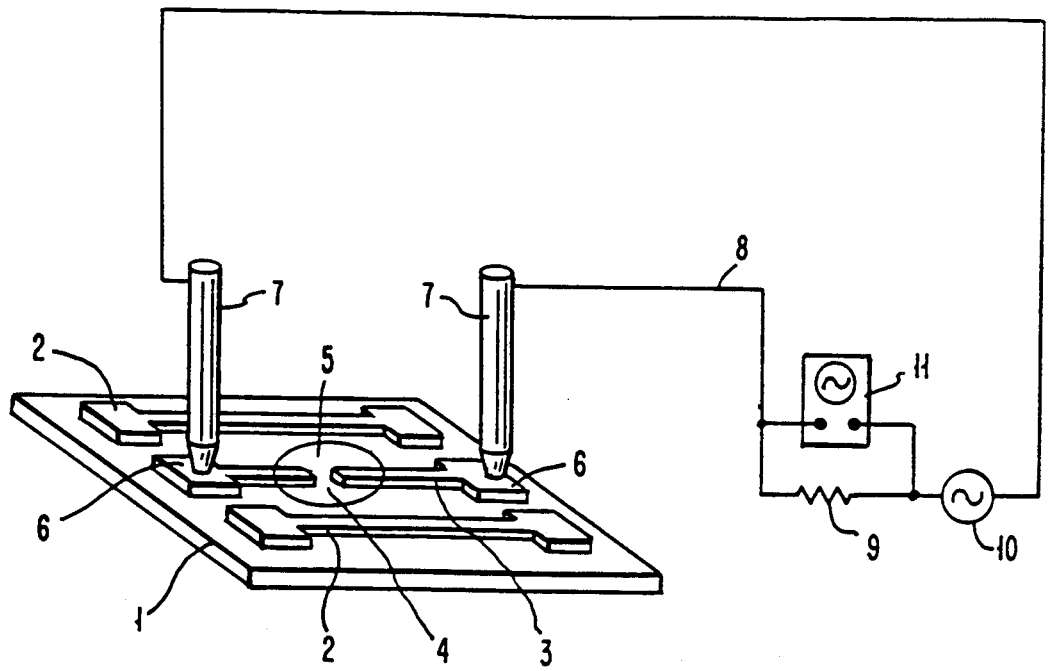
FIG. 1 is a perspective schematic of one embodiment for repairing an open circuit in accordance with the present invention.

The method of the present invention is applied to circuits preferably comprising copper leads, however it is equally applicable to circuits comprising gold, and the noble metals especially platinum and palladium.

The metal ion solutions referred to herein comprise metal ions provided from those elements which are electrochemically compatible with the metal comprising the lead or line in the circuit. Thus the metal ion solution should be capable of providing ions to form a metal growth which growth ultimately over time will form a bridge between the gap in the open circuit.

It is believed that the copper deposition mechanism of the first step of the present invention is similar to that observed for near-opens, disclosed above i.e. a thermally driven exchange plating.

However, in the first step of the present invention, the ac current mainly heats the relatively high resistive solution in the vicinity of the gap region, while for a near-open system, Joule losses occur in the narrowed copper region.

For open repair according to the present invention, it is believed that some of the heat generated in the reaction is transferred from the plating solution to the ends of the open line by thermal conduction. It is believed that the resulting thermal gradient along the circuit line gives rise to exchange plating by the thermobattery effect. The neutral (unacidified) copper sulfate solution used in the first step at the molar concentrations typically used herein (0.3-1.0 M) has a solution resistance that is higher by an order of magnitude compared with that of the acidified copper sulfate of comparable molarity used in the second repair step and for near-open SIR. Therefore the unacidified solution will attain a considerably higher temperature via local Joule effect heating for a given current compared with that attained for example by acid copper.

It has been determined experimentally that copper dendrites will not grow across a circuit break greater than a few microns in even weakly acidified copper sulfate (using 0.05 M $H_2SO_4$) at any driving frequency. Acidification not only lowers the solution resistance which leads to a decrease in local heating, but also upon application of the ac current (voltage) causes substantial attack on the copper near the break. In addition, a widening of the break with application of the voltage and an accompanying dulling of the copper lines, presumably due to copper dissolution and enhanced acid attack is observed with acidification.

An alternative initial open circuit repair step pursuant to the present invention can be accomplished using an electroless plating solution in place of the unacidified copper sulfate. When an electroless plating solution is used, high frequency ac is applied to the open ends of the break in the circuit. In that case, locally enhanced deposition occurs due to the high frequency ac heating of the solution in the region of the break. This may be due to either the exponential temperature dependence of plating rates generally exhibited by electroless solutions, or to local disproportionation, or both.

Here, it has been found to be beneficial during the first step, to use high frequencies. For these electroless copper solutions, it has been determined that 1 MHz works very well while 1 KHz works poorly with growth not limited solely to the region of the open. Hence a definite frequency selectivity from several kHz to 2 MHz is involved. In addition, it is not necessary to keep the probes out of the solution for either the unacidified copper or the electroless solutions.

For the case in either the electrolytic or electroless embodiment where there is a substantial gap, metallic seeding, for example, copper, platinum or palladium, has been used to join the open ends. If the seed layer is so thin to be an electrically discontinuous metal layer when measured in air, i.e. infinite resistance, the electric fields resulting from the applied ac voltage will concentrate along the seed layer. The accompanying current flow causes local heating along the seed when contacted by either unacidified copper sulfate (no reducing agents) or electroless copper solutions with accompanying copper deposition along the seed. Electrical continuity is thereby established. High frequency ac is required to prevent plating along the entire line, an effect observed near or below 1 kHz.

For those cases where the initial seed layer noted above results in a finite resistance bridge (on the order of 10's of ohms) final repair of a gap to a low resistance value (on the order of 1 ohm) is usually achieved using low frequency (high frequency may also be used) ac current with acid or electroless copper solutions. The high frequency intermediate step is then omitted.

Additional parameters that affect ac open circuit repair are concentration of the electrolyte, aspect ratio (defined here as the ratio of the length of the break to that of the line width), and geometry of the ends of the circuit break. For example, sharp ends at the break concentrate the electric field and cause maximum heating and deposition in the region of the break. Generally, circuits having sharp (as opposed to rectangular) ends or small aspect ratios (i.e. <0.25) are the most readily repaired with considerable reliability.

Figure 2:
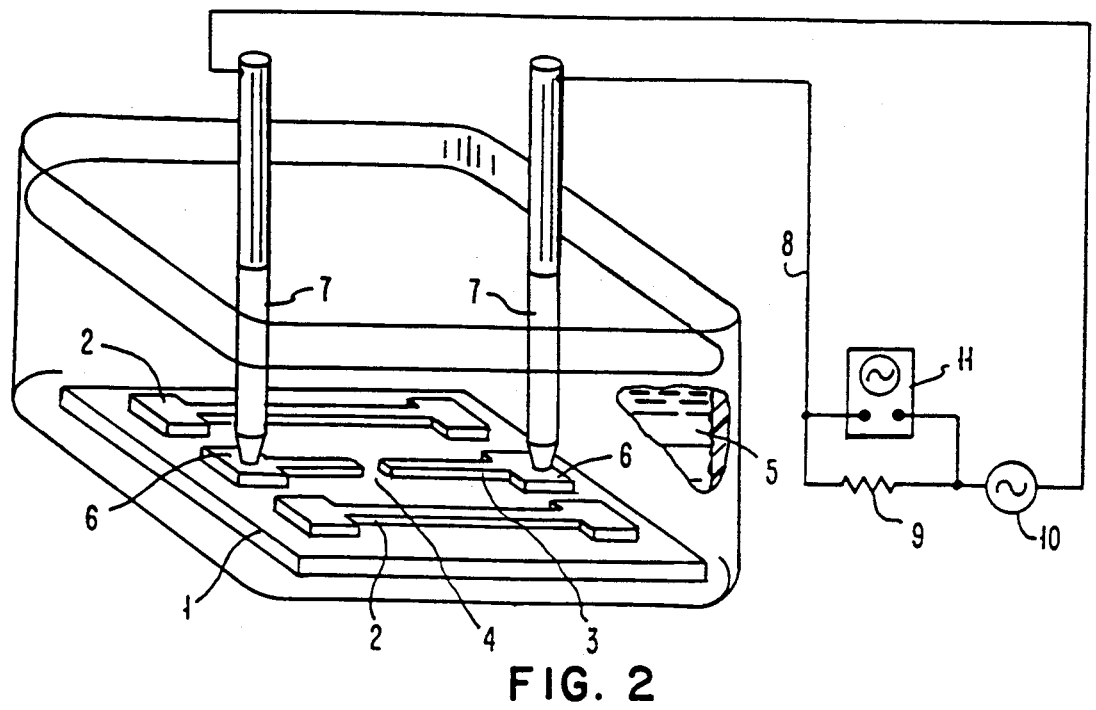
FIG. 2 is a perspective schematic of alternative embodiment for repairing an open circuit in accordance with the present invention.

The description of the present invention with respect to the initial metallic growth which occurs in step 1 of the present invention set forth above is conveniently exemplified by referring to FIGS. 1 and 2 of the drawings. FIG. 1 is a schematic perspective drawing which illustrates the various elements involved in the first step of repairing opens. FIG. 1 discloses a packaging assembly, more specifically a printed circuit board. Insulating substrate 1 comprises the material described previously. The substrate contains on it normal metal lines 2 and a defective metal line 3. The circuit open 4 is the area that must undergo repair. In accordance with the present invention, a drop of plating solution, preferably unacidified copper sulfate solution, 5 is contained in place by any liquid confining device or by surface tension. This solution must cover the defect 4 in metal line 3. Metal probes 7 preferably made of copper or copper alloys are placed in contact with the pads or ends 6 of defective line 3. Wires 8, resistor 9 and high frequency current source 10 constitute the electrical circuit which is used to promote the repair. Optionally an oscilloscope or voltmeter 11 can be placed in the circuit. The repair is effected at 4 by passing high frequency current from 10 through line 8 and probe 7 to pad 6. The current passes through pad 6 to the break in line 3 at 4 and then through the solution 5 at break 4. While the current is flowing solution 5 heats up. As the current flows through the solution at break 4 significant localized Joule heating occurs in region 4. The heat transferred to the end 3 at break 4, causes a shift in the rest potential thereby causing the ends of 3 in contact with the copper sulfate solution to become cathodic. As a result, an initial metallic growth occurs across the open in the circuit. While the ends of line 3 are cathodic, the colder (by comparison) adjacent regions become anodic and copper dissolution from the colder regions occurs and charge neutrality of the total reaction is maintained.

The process described above relates to an electrolytic system using copper as the metal. The process can also be used to repair opens using an electroless copper per solution. Referring to FIG. 1, an electroless copper plating solution is used and a high frequency current is applied to the break 4 in line 3. The copper metal buildup progresses similar to that described above with respect to the electrolytic copper process.

An alternative embodiment as illustrated in FIG. 2 can also be used to repair opens with the same beneficial results obtained using the system illustrated in FIG. 1. The embodiment of FIG. 2 differs from that of FIG. 1 in that the printed circuit board system (depicted at 1–4, 6 of FIG. 2) is totally immersed in plating solution 5. The reaction mechanism is the same except that for the unacidified copper sulfate solution, in addition to the anodic dissolution of copper from plates 2 and 3, anodic dissolution can also occur from portion of immersed probes 7 especially if they contain copper.

Experiments on the repair of open circuits indicate a strong dependence on the applied ac frequency. This is found for metal depositions occurring from both unacidified copper sulfate and electroless solutions. To establish the required temperature gradient for thermally driven exchange plating, Joule heating of the solution must occur. The electrical equivalent circuit for the impedance of the solution and the open line can be represented by a resistance R, the solution resistance, in series with two parallel branches, $Z_{DL}$ and $Z_f$. The double layer impedance, $Z_{DL}$ consists of a frequency dependent capacitance (for $Cu^{++}$ in $H_2SO_4$ and $CuSO_4$) in parallel with a frequency dependent leakage resistor. $Z_f$ represents the Faradaic impedance and consists of a capacitance and the parallel Faradaic resistance, both with an inverse frequency dependence over a range extending up to several kHz. Typically, double layer capacitance values are on order of 20 $\mu f/cm^2$, increasing somewhat at very low the frequencies (<50 Hz). Thus, at relatively low frequencies the reactive impedance of the circuit passes proportionately smaller currents compared with that for high frequencies for a given applied voltage, consequently less solution heating takes place. Data on the ac current as a function of frequency were determined for an open circuit on a glass-epoxy substrate covered by unacidified 0.3 M copper sulfate solution in the vicinity of the break. The applied ac voltage was kept constant at 1 volt peak to peak and only the frequency varied. The data showed a decrease in the capacitive reactance of the circuit as evidenced by the increasing current through the circuit with increasing frequency. It should be emphasized that current flows in the solution along multi-parallel paths to the break as the solution is in contact with a certain portion of the circuit. The extent of contact depends upon the circuit area covered by the electrolyte. These observations support the theory that there is an improved open repair capability in the kHz frequency range although there is no indication of commercial plating above 5 kHz. As noted, 5 kHz is considerably higher than required or typically used for near-open repair in acid copper sulfate solution, where 60–100 Hz is quite effective.

Near-opens also differ from open circuits in the present context since localized Joule heating occurs at defect sites due to the applied ac current within the copper circuit rather than by way of losses within the solution. The local temperature gradient required for copper deposition onto a neckdown (by thermally driven exchange plating) is established by conduction of heat from the circuit to the solution and is not represented by the same equivalent electrical circuit applicable to open circuit repair.

The effect of circuit geometry is best illustrated by comparing the repair for relatively small and large opens.

For small opens, that is where the aspect ratio is <1, the electric fields within the open circuit can be approximated by a capacitor with the two plates defined by the ends of the circuit break. The electric field in the plane of the substrate between the parallel "capacitor" plates is constant and at right angles to the circuit break. At the edges of the circuit break, the field lines spread similar to the fringing fields of a capacitor. There are also fringing fields in the vertical direction extending throughout the break since the height of the break is small. The magnitude of these fields is strongly dependent on the height of the electrolyte over the break.

This description of the electric fields is generally consistent with the copper growth, observed to be concentrated between the regions of the break for small aspect ratios. Deviations from this occur when the aspect ratio becomes large (i.e. >3). Here, much of the field is no longer perpendicular to the "capacitor plates" and some deposition can occur outside the immediate region of the break. In addition, there is also a tendency for the growth to be non-planar. This can result in the lack of physical contact between the deposited copper and the substrate.

For larger aspect ratios, bridging may be incomplete. For those cases, electrical continuity is not readily established without a pre-deposited metallic seed layer.

Planarity of repairs can be controlled by placing a thin glass or other electrically non-conducting material over the gap region during the unacidified repair stage. This allows the solution to contact the ends of the broken circuit while preventing growth in the vertical direction. The degree to which growth occurs in the vertical direction without a cover slide is in part strongly dependent on the aspect ratio. For the repair of cracks, planarity is generally assured without resorting to any additional means for physical constraint of the plated copper.

Pursuant to the present invention, electroless copper can be used to bring about repair of a number of different metallic circuits containing an open. Electroless copper is catalytic on Cu, Au, Ag, Pt, Fe, Co, Ni, Pd, and Rh.

Alternatively gold electroless solutions can be used for the repair of Au, Ag, Pd, Pt and Cu circuits for the first repair step. Electroless copper and gold particularly are suitable for the first repair step since the initial bridge resulting from the first repair step can be plated up to achieve low resistance using the thermobattery effect; that is for the case of electroless copper as the first repair step, acid copper sulfate solutions can be used for the second repair step while gold cyanide or acid gold high speed plating solutions can be used to plate up the electroless gold to achieve a low resistance repair. The plating solution may be an acidified electrolyte solution comprising 0.5 M $CuSO_4$ and 0.25 M $H_2SO_4$ or a solution comprising palladium. The gold cyanide solution may have a concentration of 32.4 g/l. These and other examples of compatible solutions for the first repair step can be found in F. Pearlstein, Modern Electroplating, Chapter 31, pp. 710-747 (John Wiley & Sons 1974).

In order to demonstrate the invention in greater detail, the following example is included.

EXAMPLE

Numerous open test circuits consisting of copper lines of varying widths deposited on several substrate compositions were repaired using the high frequency repair technique. Gaps ranged from 50 to 150 $\mu$m (aspect ratios between about 0.5 and 1.5) for unseeded lines and up to several hundred $\mu$m for repairs using thin electrically discontinuous pre-seeding.

Initial work was done on test samples disposed on a glass-epoxy substrate. The copper lines, plated to a height on the order of 25 $\mu$m were obtained by back etching photolithographic patterns consisting of 100 $\mu$m wide lines spaced on the order of 10 linewidths from one another. Copper pads at the ends of 1.25 cm lines provided convenient contact areas for both repair steps and subsequent resistance measurements. Deliberately placed gaps in the photolithographic pattern provided natural "opens" for repair. The missing copper resulted in gaps with edges generally perpendicular to the lines.

Other samples consisted of teflon substrates approximately 50 $\mu$m thick. Here the copper lines, consisting of a generally similar geometry as described for the glass-epoxy samples, were only 9 $\mu$m high with 25 $\mu$m and 50 $\mu$m widths. The opens or gaps in the lines varied from between 25-350 $\mu$m. A second pattern consisted of three 50 $\mu$m lines spaced one linewidth apart. Most of these successfully repaired samples utilized 0.3 M-0.5 M unacidified copper sulfate solution together with a sine wave voltage generator set at a frequency of 2-1,000 kHz. The applied current was read on an oscilloscope via the voltage appearing across a 55 ohm dropping resistor. In general (and especially for the 25-50 $\mu$m wide lines) the current was ramped up slowly during both stages of repair. The alternating current amplitude is an important factor in the first step of the process of the instant invention, as it should be sufficient to initiate metallic growth without deleteriously affecting said metal growth during formation. Initial growth was observed for currents in the range of between about 3 and 10 milliamps peak to peak. Careful current monitoring during repair is especially important to avoid burning out the delicate copper bridge during incipient formation. The repair was simultaneously monitored optically, either with a microscope or a video display. Typically, the time required to grow a conducting bridge varied from 1-3 minutes, depending on the particular geometry of the break and the aspect ratio. In the experiments covered herein, this ratio varied mostly from between 0.5-1. Once electrical continuity was established as a result of the copper growth, the current rose abruptly by as much as a factor 3 or more due to the sudden drop in circuit resistance.

The applied voltage was decreased at this time to prevent overheating and burn-out of the copper bridge. The repair was continued at a lower voltage to further strengthen the mechanical contact at the ends and to increase the thickness of the bridge by additional controlled deposition. A very small area was connected. However this area was sufficient to give reasonably low electrical resistance and is a good example of the first stage of the two step repair process. Bridges consisted generally of one or more dendrites (for unacidified copper sulfate solution) that grew from either end of the break to the corresponding opposite end. The smaller the gap, the easier the first stage repair process became since the electric field was concentrated between the open ends. Larger aspect ratios have been repaired by the present technique but are not easily repeatable. At the opposite limit, repair of small cracks has been found to be reliable and repeatable. Also observed was the phenomenon that for small aspect ratios, the repair of closely spaced lines, i.e. 100 $\mu$m center to center, could be repaired without the danger of copper growing from the section under repair to the adjacent line to cause a short. Repair of small opens has resulted in line impedances on the order of 1-80 ohms after the unacidified copper repair stage. Occasionally, values in the kilo ohm range have resulted and may be about 100 kiloohms or less. After the second repair, resistance values of from 0.2-0.5 ohms for the lines on the epoxy-glass substrate were found and on the order of 1 ohm for the samples on teflon using two point probe resistance measurements.

The experiment conducted as set forth above describes a new method based on SIR principles for the repair of small opens on circuit boards. Localized copper growth in the region of the gap is obtained using unacidified copper sulfate (containing no reducing agents) or electroless copper solutions stimulated by the passage of high frequency (>1 kHz) current across the gap.

While the invention has been particularly shown and described with respect to preferred embodiments thereof, it will be understood by those skilled in the art that the foregoing and other changes in form and details may be made therein without departing from the spirit and scope of the invention.

Having thus described our invention, what we claim as new, and desire to secure by Letters Patent is:

1. A method for repairing an open in an electronic circuit disposed on a substrate comprising the following steps:

contacting the open circuit disposed on said substrate with a first plating solution containing metal ions which are electrochemically compatible with the metal comprising the circuit, passing an alternating current having a frequency of between about 0.04 kHz and 5000 kHz through said open circuit, said solution acting to complete the current path;

continuing to pass said current for sufficient time to obtain localized Joule heating in said solution, a portion of said Joule heat being transferred to said circuit by thermal conduction from said solution resulting in an initial metallic growth forming across said open in said circuit, continuing said growth until the infinite resistance of the open reaches a finite value, said current having an amplitude sufficient to initiate said metallic growth without deleteriously affecting said metal growth during formation, thereafter contacting the treated site containing the metallic growth with a second plating solution and applying a current having a frequency of about 60 Hz or more for such time as is required for the resistance per unit length of the metal formed in the gap to become comparable to the resistance per unit length for the rest of the circuit.

2. The method defined in claim 1 wherein said initial metallic growth is the result of a shift in the rest potential at the heated solution-circuit interface in the vicinity of said open, thereby causing said vicinity of said open to become cathodic.

3. The method defined in claim 2 wherein said first plating solution is an unacidified copper sulfate solution.

4. The method defined in claim 2 wherein the localized Joule heating results in disproportionation leaving said metallic growth in the vicinity of the open.

5. The method defined in claim 4 wherein said second plating solution is an acidified electrolyte.

6. The method defined in claim 5 wherein said acidified electrolyte comprises 0.5 M $CuSO_4$ and 0.25 M $H_2SO_4$.

7. The method defined in claim 6 wherein said metal comprising said circuit is selected from the group consisting of Cu, Au, Ag, Pt, Fe, Co, Ni, Pd, and Rh.

8. The method defined in claim 7 wherein said frequency of the ac current is between about 2 and 1000 kHz.

9. The method as defined in claim 8 wherein said finite resistance is about 100 kilo-ohms or less.

10. The method defined in claim 9 wherein said alternating current is between about 3 and 10 milliamps peak to peak.

11. The method defined in claim 5 wherein said acidified electrolyte comprises palladium.

12. The method defined in claim 4 wherein said second plating solution comprises gold cyanide having a concentration of 32.4 g/l.

13. The method defined in claim 12 wherein said metal comprising said circuit is selected from the group consisting of Au, Ag, Pd, Pt and Cu.

14. The method defined in claim 13, wherein said frequency of ac current is between about 2 and 1000 kHz.

15. The method defined in claim 14 wherein said finite resistance is about 100 kilo-ohms or less.

16. The method as defined in claim 15 wherein said alternating current is between about 3 and 10 milliamp peak to peak.

17. The method defined in claim 2 wherein prior to said initial metallic growth, an electrically discontinuous metallic seed is deposited between the ends of said open circuit.

18. The method defined in claim 17 wherein the lower limit of the frequency of the ac current passing through said metallic seeded open circuit is about 1 kHz.

19. The method defined in claim 1 wherein said first plating solution contains a reducing agent and is in contact with a catalytic surface, and said metallic growth is the result of the exponential increase in plating rate with increased temperature.

20. The method defined in claim 19 wherein the localized Joule heating results in disproportionation leaving said metallic growth in the vicinity of the open.

21. The method defined in claim 19, wherein prior to said initial metallic growth, an electrically discontinuous metallic seed is deposited between the ends of said open circuit and the lower limit of the frequency of the ac current passing through said metallic seeded open circuit is about 1 kHz.

22. The method defined in claim 1 wherein prior to said initial metallic growth, an electrically discontinuous metallic seed is deposited between the ends of said open circuit and the lower limit of the frequency of the ac current passing through said metallic seeded open circuit is about 1 kHz.

* * * * *